US012669539B2

(12) United States Patent　　(10) Patent No.: US 12,669,539 B2
Lin et al.　　(45) Date of Patent: Jun. 30, 2026

(54) DEFECT DETECTION MODULE

(71) Applicant: Feng Chia University, Taichung City (TW)

(72) Inventors: Yue-Der Lin, Taichung City (TW); Yin-Sheng Chen, Taichung City (TW)

(73) Assignee: Feng Chia University, Taichung City (TW)

( * ) Notice: Subject to any disclaimer, the term of this patent is extended or adjusted under 35 U.S.C. 154(b) by 114 days.

(21) Appl. No.: 18/603,951

(22) Filed: Mar. 13, 2024

(65) Prior Publication Data

US 2025/0251448 A1　　Aug. 7, 2025

(30) Foreign Application Priority Data

Feb. 26, 2024　(TW) ................................. 113106870

(51) Int. Cl.
　G01R 31/312　　(2006.01)
　G01R 31/28　　(2006.01)
(52) U.S. Cl.
　CPC ....... G01R 31/312 (2013.01); G01R 31/2841 (2013.01)

(58) Field of Classification Search
None
See application file for complete search history.

(56) References Cited

U.S. PATENT DOCUMENTS

| | | | | |
|---|---|---|---|---|
| 8,872,526 | B1 * | 10/2014 | Hoshtanar | G06F 3/0443 |
| | | | | 324/658 |
| 9,019,220 | B1 * | 4/2015 | Klein | G06F 3/0418 |
| | | | | 345/173 |
| 10,866,314 | B2 * | 12/2020 | Skoglund | G01N 29/226 |
| 2015/0145814 | A1 * | 5/2015 | Burger | H03K 17/955 |
| | | | | 345/174 |
| 2018/0053806 | A1 * | 2/2018 | Chao | G06V 40/1329 |

* cited by examiner

*Primary Examiner* — Jermele M Hollington
(74) *Attorney, Agent, or Firm* — Best & Flanagan LLP

(57)　　ABSTRACT

A defect detection module comprises a signal emitting module, a transmitting electrode, a receiving electrode, and a signal processing module. The signal emitting module of the present invention emits a first signal. The first signal passes through the transmitting electrode, a medium and the receiving electrode to generate a second signal. The transmitting electrode, the medium and the receiving electrode forms a capacitance value corresponding to the medium which may be solid or comprising air. The signal processing module processes the second signal to obtain a detection result.

8 Claims, 8 Drawing Sheets

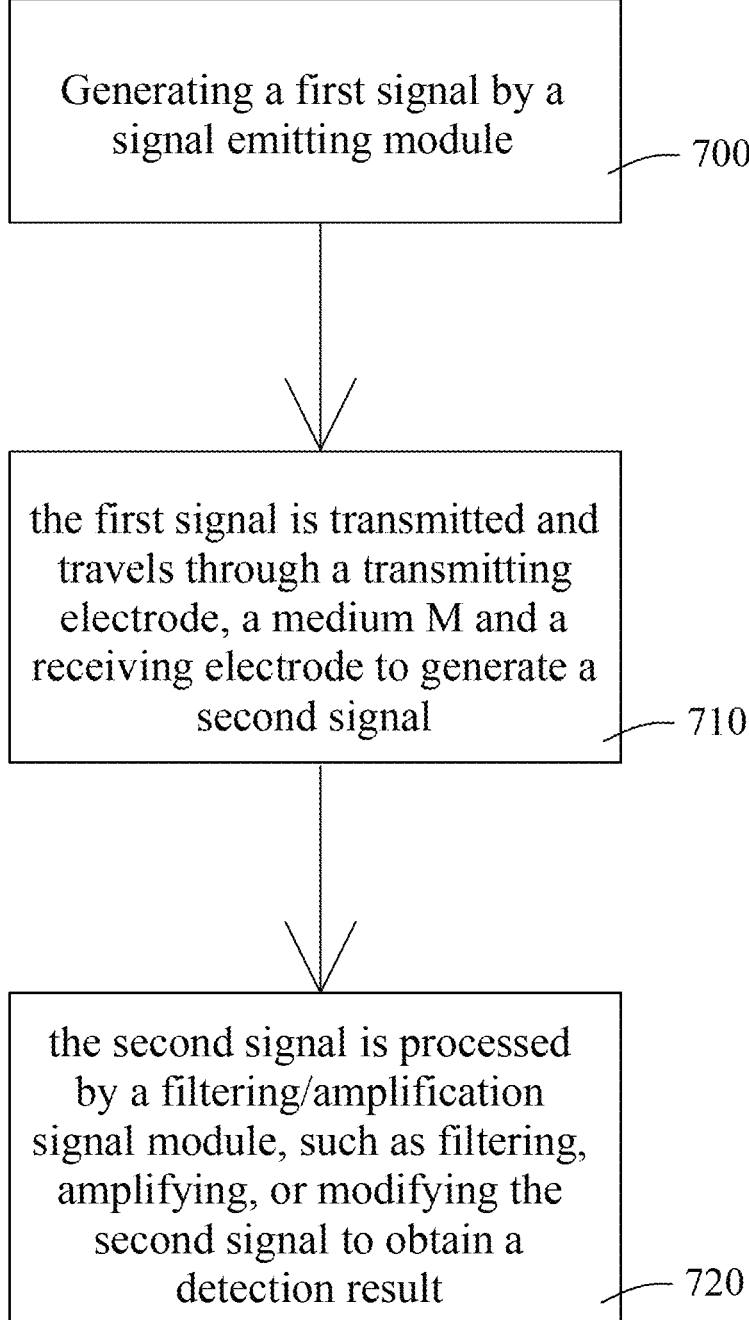

Generating a first signal by a
signal emitting module

~ 700 the first signal is transmitted and
travels through a transmitting
electrode, a medium M and a
receiving electrode to generate a
second signal

~ 710 the second signal is processed
by a filtering/amplification
signal module, such as filtering,
amplifying, or modifying the
second signal to obtain a
detection result

DEFECT DETECTION MODULE

FIELD OF INVENTION

The present invention relates to a defect detection module, more specifically to a non-destructive module for defect detection on substrates including but not limited to circuit board substrate.

BACKGROUND OF THE INVENTION

In the conventional circuit board component defect detection, a metal electrode on a detecting probe is often used to directly contact the copper wires on the circuit board to input signals and test whether the circuit board contains any abnormalities or defects. However, the copper wires are relatively soft and could be easily damaged by a metal electrode on the detecting probe. Because the damaged copper wires cannot be repaired, this defect detection method using the detecting probe can only be used for sampling inspection, making it difficult to increase the detection yield and reliability of the entire batch of products.

With the development of modern science and technology, especially the widespread adoption of artificial intelligence applications, the demands on high-speed computing circuits is increasing. Nowadays, glass substrates are used to solve the problems of excessive energy consumption and poor heat dissipation caused by the unevenness of conventional printed circuit board (PCB) substrates. However, whether it is the PCB substrate or the glass substrate, when conducting circuit testing, the metal probe must be used to input signals to the copper wires on the circuit to confirm whether the circuit can be operated normally. Due to the soft nature of copper wires, they are easily damaged by the metal probe resulting in irreversible damage and leading to a decrease in product yield and reliability. The circuit test can only be performed by in sampling inspection.

Meanwhile, in current industry practice, Through Glass Via (TGV) still lacks perfect non-destructive detection method without touching it physically. In order to detect whether the glass has been successfully drilled, conventional methods use image recognition and copper plating. The accuracy of image recognition is low, which affects the product yield, and the copper plating adds additional cost to the overall production process.

Furthermore, due to the variation in capacitance values among successful drilling, undrilled, and partially drilled conditions for the Through Glass Via, the capacitance values between sensors are different and thus resulting in different received signals. Therefore, it is difficult to carry out accurate detection through the copper plating.

In view of the foregoing considerations, how to provide a non-destructive defect detection module and method for high-speed circuit glass substrates, enabling detection by non-destructive means to enhance product yield and reliability, is a pressing issue awaiting resolution in the industry. Hence, it is eager to have a solution that will overcome or substantially ameliorate at least one or more of the deficiencies of a prior art, or to at least provide an alternative solution to the problems. It is to be understood that, if any prior art information is referred to herein, such reference does not constitute an admission that the information forms part of the common general knowledge in the art.

SUMMARY OF THE INVENTION

In order to solve the above mentioned shortcomings of the prior art, the main purpose of the present invention is to provide a defect detection module comprising: a signal emitting module, a transmitting electrode, a receiving electrode, and a signal processing module; wherein; the signal emitting module generates a first signal; the first signal is transmitted and travels through the transmitting electrode, a medium and the receiving electrode to generate a second signal; wherein: the transmitting electrode, the medium and the receiving electrode form an equivalent capacitance including a capacitance of the medium which may be solid or comprising air; and a signal processing module which processes and optimizes the second signal to obtain a detection result.

From the above description, it can be seen that the present invention includes the following advantages and beneficial effects:

1. The defect detection module of the present invention is particularly suitable for non-destructive defect detection of high-speed circuit glass substrates. In any via electrode defect detection, the capacitive transmitting electrode is used to emit the first signal. Due to the different dielectric coefficients of the air in the via hole and the substrate, the strength of the second signal received by the capacitive receiving electrode is different. Then, the frequency range of the filter can be optionally adjusted, and the amplification ratio can be changed to create a difference in the signals received from the air and glass, thereby detecting whether the drilling is successful.

2. In the inspection of circuit board components, the capacitive electrodes provided by the present invention can replace the existing metal electrode on the detecting probe in a coupling manner to emit signals without contacting the circuit board components. Preferably, the signals are further filtered and amplified, and the signal received from the opposite side of the medium is detected by the capacitive detection technology to complete the analysis of whether the drilling is successful based on the detected signals, thereby achieving high detection accuracy.

Many of the attendant features and advantages of the present invention will become better understood with reference to the following detailed description considered in connection with the accompanying figures and drawings.

BRIEF DESCRIPTION OF THE DRAWINGS

The steps and the technical means adopted by the present invention to achieve the above and other objects can be best understood by referring to the following detailed description of the preferred embodiments and the accompanying drawings.

FIG. 7 is a flow chart of the non-destructive defect detection method for high-speed circuit glass substrates of the present invention.

DETAILED DESCRIPTION OF THE PREFERRED EMBODIMENTS

Figure 1:
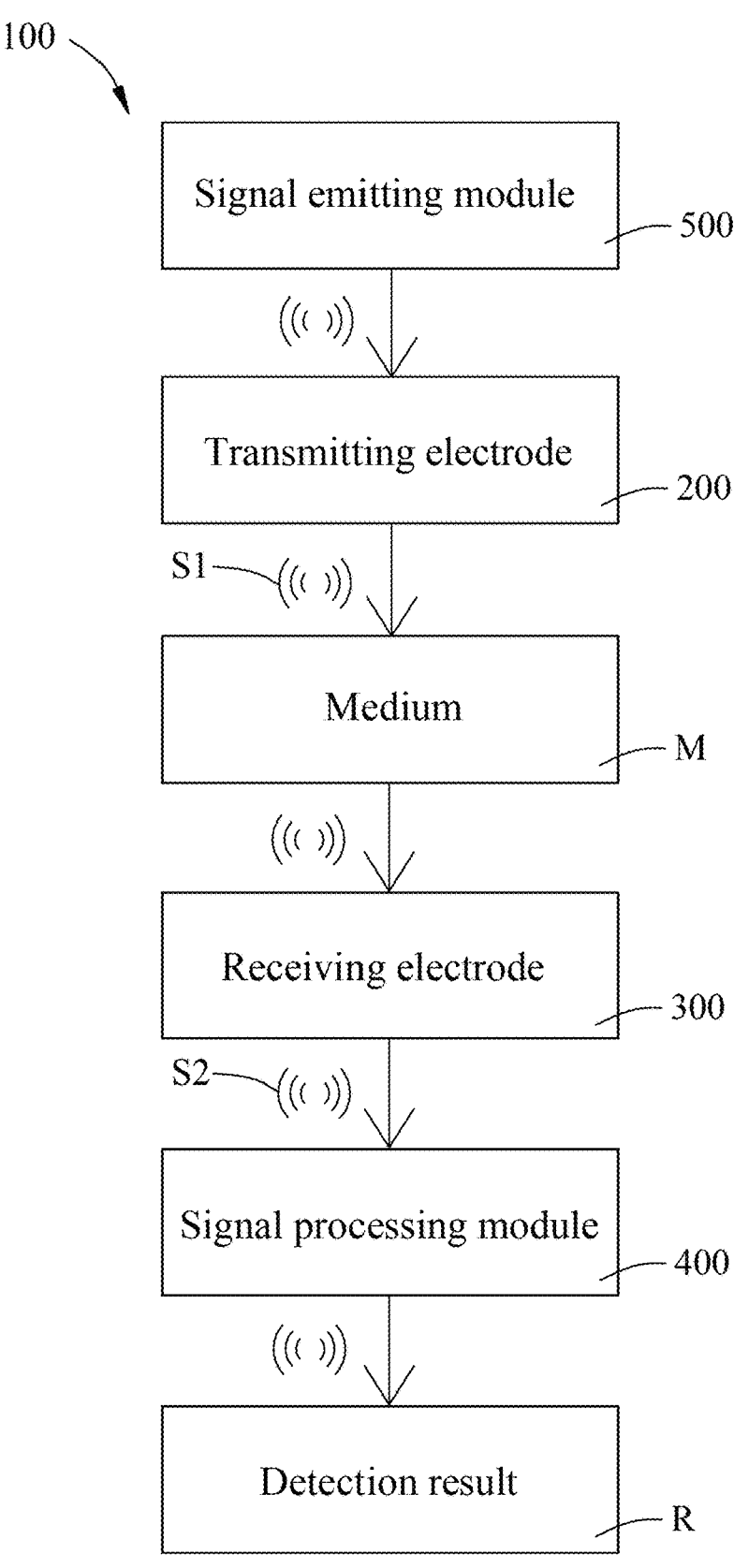
FIG. 1 is a schematic diagram of a system flow chart of the non-destructive defect detection module for high-speed circuit glass substrates of the present invention.

Reference will now be made in detail to the present preferred embodiments of the invention, examples of which are illustrated in the accompanying drawings. Wherever possible, the same reference numbers are used in the drawings and the description to refer to the same or like parts. It is not intended to limit the method by the exemplary embodiments described herein. In the following detailed description, for purposes of explanation, numerous specific details are set forth in order to attain a thorough understanding of the disclosed embodiments. It will be apparent, however, that one or more embodiments may be practiced without these specific details. As used in the description herein and throughout the claims that follow, the meaning of "a", "an", and "the" may include reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to.

<Defect Detection Module>

With reference to FIG. 1, the present invention provides a defect detection module 100, which is preferably used on a non-destructive defect detection of high-speed circuit glass substrates. The defect detection module 100 comprises a signal emitting module 500, a transmitting electrode 200, a receiving electrode 300, and a signal processing module 400. The signal emitting module 500 generates a first signal S1. The first signal S1 is transmitted and travels through the transmitting electrode 200, a medium M and the receiving electrode 300 to generate a second signal S2.

The transmitting electrode 200, the medium M and the receiving electrode 300 have an equivalent capacitance including a capacitance of the medium M which may be solid or comprising air.

The signal processing module 400 preferably includes filtering and/or signal amplification modules to process and to optimize the second signal S2 to obtain a detection result R.

Specifically, the first signal S1 emitted from the transmitting electrode 200 is transmitted to the receiving electrode 300 by coupling into the medium M. The medium M of the present invention includes glass, silicon, air or a combination thereof. In this preferred embodiment, in order to receive a stable target signal, the first signal S1 emitted from the transmitting end (i.e., the transmitting electrode 200) of the present invention is preferably a 500 Hz square wave to adapt Taiwanese main power supply in 60 Hz which will greatly affect the waveform of defect detection or circuit verification. However, 500 Hz square wave is one of a preferred embodiment for adapting to Taiwanese main power supply. It is understandable that the present invention can adjustably having different wave for different power supply in different condition.

<Preferred Embodiment(s)>

Figure 2A:
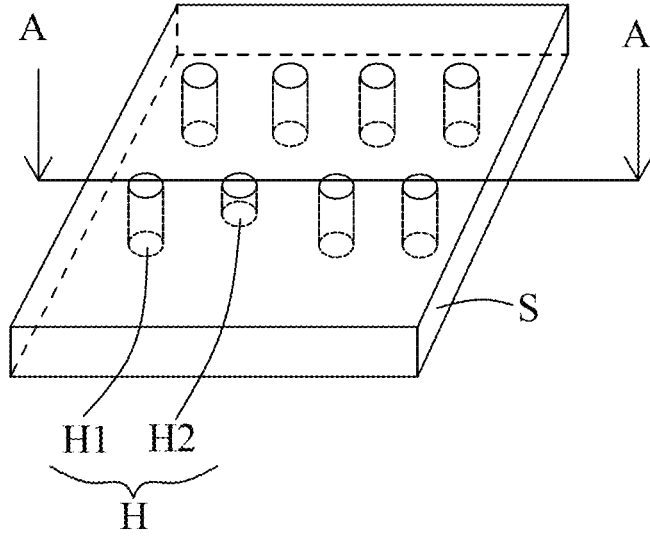
FIG. 2A is a schematic diagram of the configuration of via holes H on the substrate of the present invention.
Figure 2B:
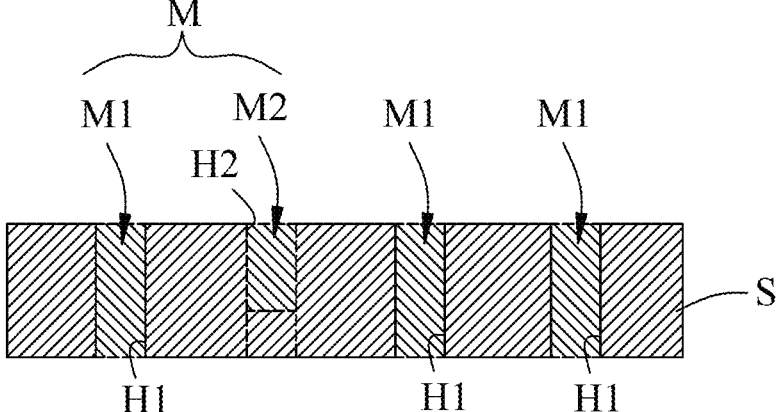
FIG. 2B is a sectional view along A-A' of FIG. 2A.
Figure 3:
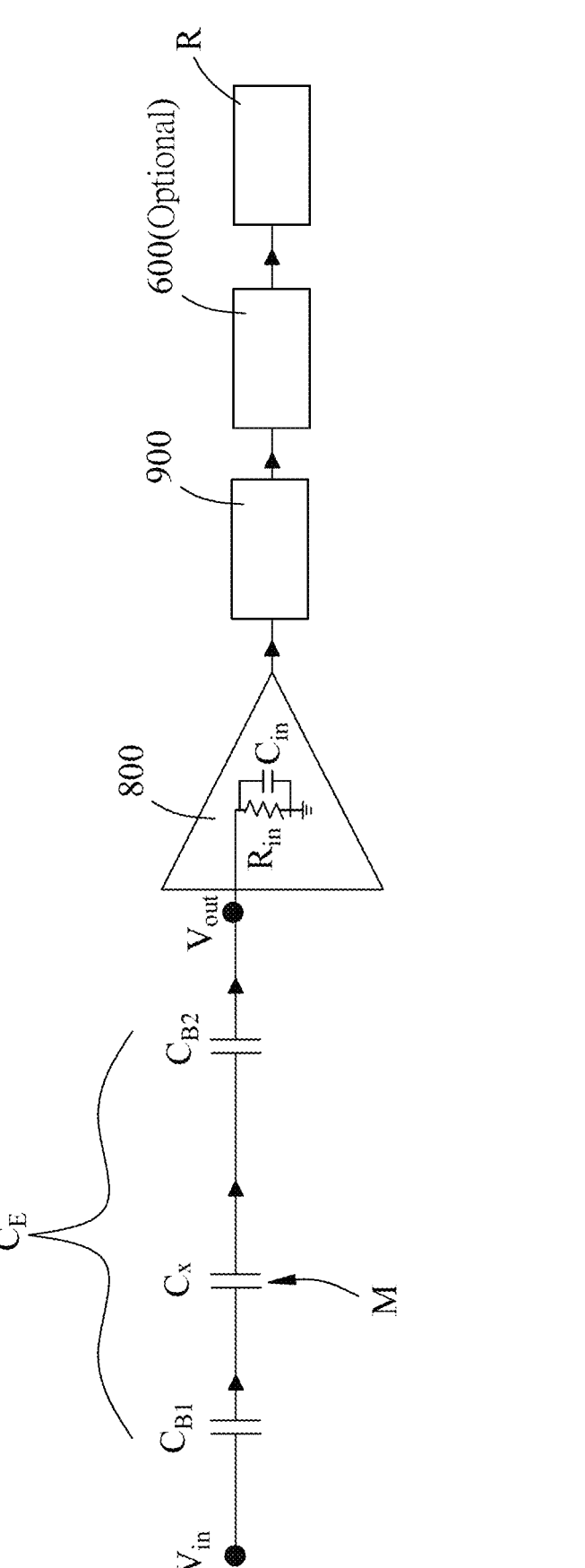
FIG. 3 is a schematic diagram of an embodiment of the non-destructive defect detection module for high-speed circuit glass substrates of the present invention.

Referring to FIGS. 2A, 2B and 3, in this embodiment, a substrate S, such as a glass or silicon substrate, is used. More preferably, one preferred embodiment of the substrate includes but not limited to circuit board substrate. The substrate S is provided with at least one via hole H, which becomes a via substrate, also known as a Through Glass Via (TGV) or a Through Silicon Via (TSV). As shown in FIG. 2, the via hole H may comprise a through hole H1 or a non-through hole H2. The medium M described herein may be either a medium M1 with through hole H1 filled with air or a medium M2 with non-through hole H2 (or partially through hole) combined with air and glass or silicon substrate.

The transmitting electrode 200 of the present invention is positioned above the via hole H and emits the first signal S1, which passes through the medium M in the via hole H to become the second signal S2, which is received by the receiving electrode 300 positioned below the via hole H, and the received second signal S2 is then optionally processed by the signal processing module 400 to obtain the detection result R. In this embodiment, both the transmitting electrode 200 and the receiving electrode 300 used are capacitive electrodes having a transmitting electrode capacitance value $C_{B1}$ and a receiving electrode capacitance value $C_{B2}$. In combining with a medium capacitance value $C_x$, therefore, in an equivalent circuit, they can be understood as an equivalent capacitance $C_E$.

In this embodiment, taking a glass substrate as an example, the capacitance value $C_x$ of the medium M in the via hole H can be represented by the following Equation (1):

$$C_x = \varepsilon_0 \varepsilon \frac{A}{d} \qquad \text{Equation (1)}$$

In the above Equation (1), A is the coupling area of the via hole H (m²), d is the length/distance of the via hole H (meter), ε is the relative permittivity of the medium M (F/m), and $\varepsilon_0$ is the permittivity in vacuum (F/m).

The total signal gain $$\frac{V_{out}}{V_{in}}$$

of the first signal S1 and the second signal S2 is represented by the following Equation (2):

$$\frac{V_{out}}{V_{in}} = \frac{j \cdot 2\pi \cdot f \cdot R_{in} \cdot C_E}{1 + j \cdot 2\pi \cdot f \cdot R_{in} \cdot (C_{in} + C_E)} \qquad \text{Equation (2)}$$

With reference to FIG. 3, the first signal S1 passes through the glass substrate $C_x$ from the transmitting electrode $C_{B1}$ to generate the second signal S2, which is received by the receiving electrode $C_{B2}$. These capacitances are integrated into the equivalent capacitance $C_E$, which is then preferably filtered and/or amplified by the signal processing module 400 at the rear end to obtain the result R. Finally, the result R can optionally perform a further machine learning classification through a computer host 600 to achieve an improved result R of the defect detection.

Moreover, as shown in FIG. 3, when the second signal S2 ($V_{out}$) is generated, a high-pass filter 800 (HPF, front-end amplifier) is formed. By taking an absolute value of $$\frac{V_{out}}{V_{in}},$$

a cutoff frequency $f_{-3\ dB}$ of the high-pass filter 800 is obtained as shown in the following Equation (3):

$$f_{-3dB} = \frac{1}{2\pi \cdot R_{in} \cdot (C_{in} + C_E)} \qquad \text{Equation (3)}$$

Since the capacitance values $C_x$ calculated for the medium M in the via hole H are different for the glass and the air, this will indirectly affect the range of the cutoff frequency $f_{-3\ dB}$. Therefore, different filters for the two cutoff frequencies can be adapted for the signals received from the glass and the air.

Further, to avoid affecting the filtering effect of the high-pass filter 800 in the subsequent circuit, a signal processing circuit 900 is used to isolate the capacitive electrodes of the transmitting electrode 200 and the receiving electrode 300 from the back-end circuit. The farther the target measurement frequency is from the mains noise, the more the line noise can be reduced by the high-pass filter 800. However, due to the differences in the measurement frequencies of each circuit, in addition to the high-pass filter 800, which can filter the noise component, to the back-end circuit, a notch filter can also be used to reduce the mains noise.

<Validation Test(s)>

Figure 4:
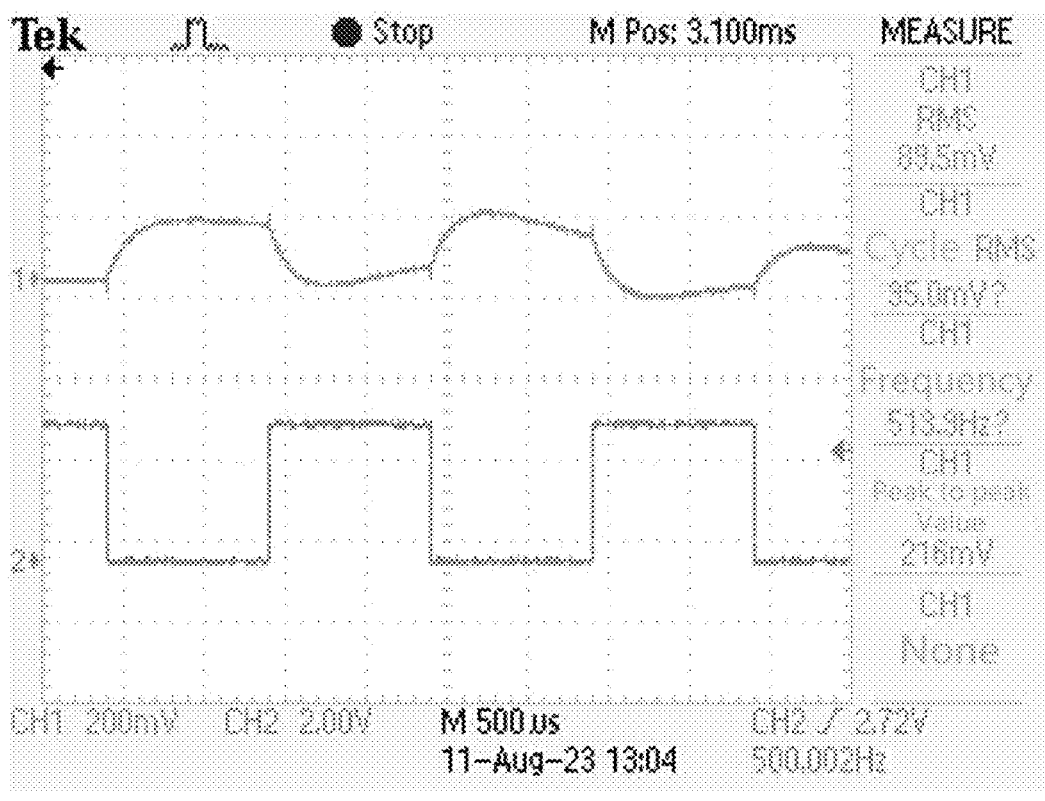
FIG. 4 is a comparison diagram of the first signal and the detection result when the medium is a glass substrate.
Figure 5:
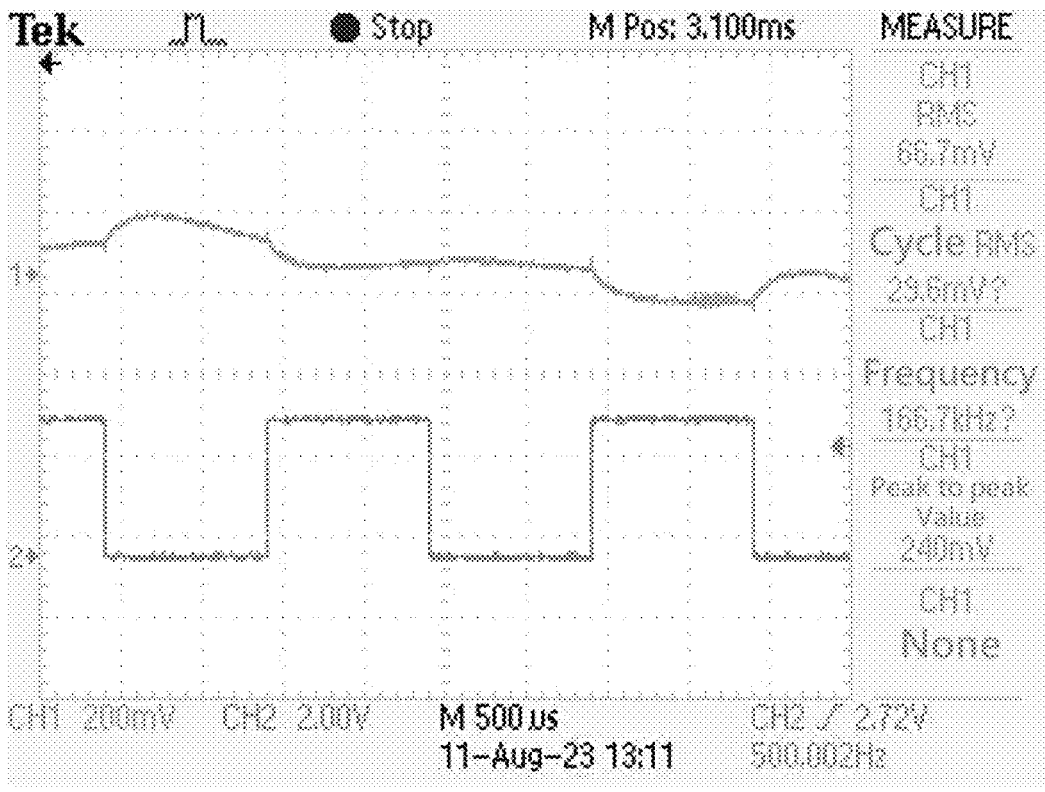
FIG. 5 is a comparison diagram of the first signal and the detection result when the medium is air.

FIGS. 4 and 5 show the experimental verification results of the present invention. The upper part of FIG. 4 shows the embodiment with the non-through hole H2 with defects in which the signal is filtered and amplified after passing through the glass, while the lower part shows the original square wave signal. The upper part of FIG. 5 shows the embodiment with the through hole H1 without defects in which the signal is filtered and amplified after passing through the air, while the lower part shows the original square wave signal.

Specifically, FIG. 4 and FIG. 5 show that the signal received by the receiving electrode 300 is synchronized with the original signal, and it is observed that the signal integrity passing through the glass is higher than that passing through the air. Therefore, it proves that the detection technology of the present invention is indeed feasible, and subsequently, by adjusting the filtering range and the amplification ratio, the differences between the two can be made more apparent. The non-destructive defect detection module 100 of the present invention can be installed on an automatic detection machine. After detecting the waveform, an artificial intelligence technology can then be used at the back-end for classification to determine whether the glass substrate has via defects.

It should be noted that, in addition to the aforementioned glass substrate, the medium M of the present invention may also be a substrate of any material, such as a silicon substrate.

Figure 6:
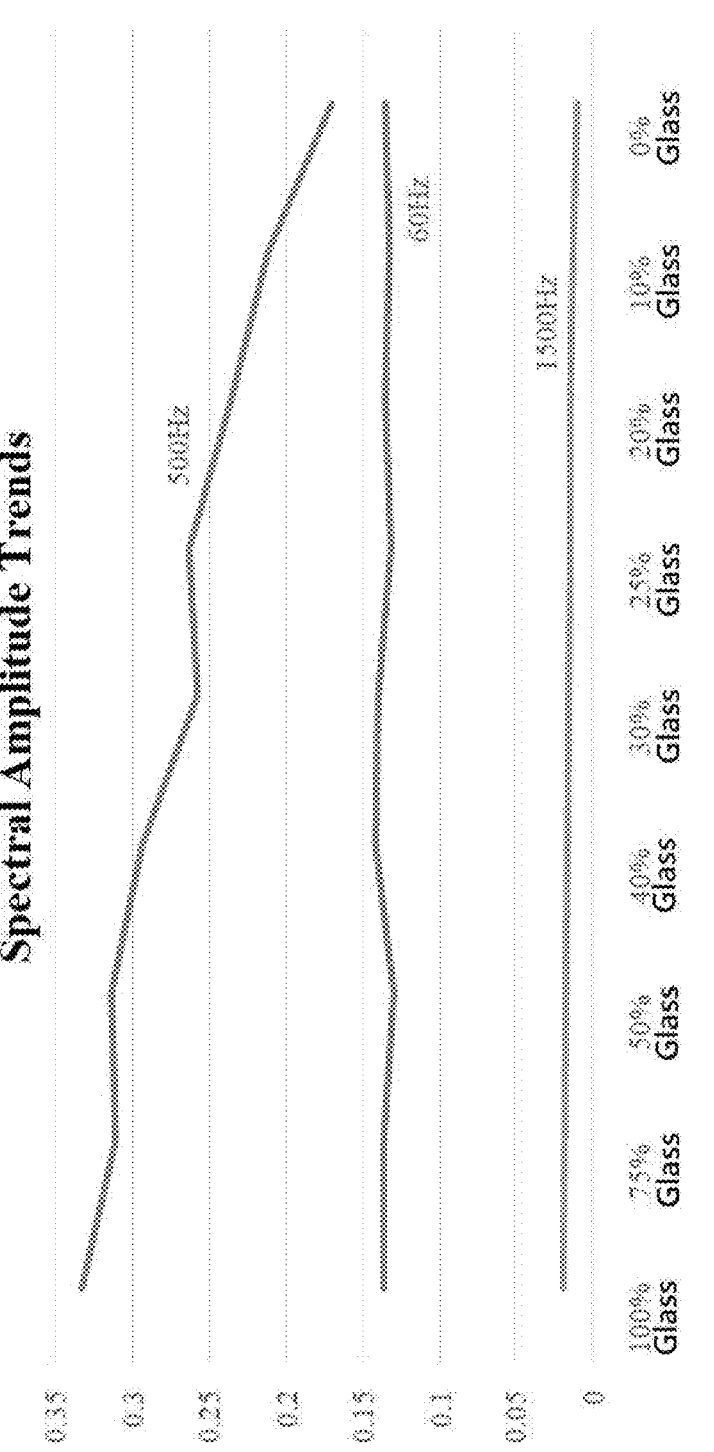
FIG. 6 is data for testing the glass substrate at different frequencies.

As shown in FIG. 6 and Table 1 below, when the first signal S1 is transmitted to the medium M, which is the drilled glass substrate, through the transmitting electrode 200 at a frequency of 500-Hz square wave, significantly different coverages can be obtained under different glasses at 500 Hz square wave (i.e., 100%, 75%, 50%, 40%, 30%, 25%, 20%, 10%, and 0%), that is, different degrees of the non-through hole H2 or the through hole H1 are significantly different in spectral amplitude. Therefore, this result can confirm that when the first signal S1 is the 500 Hz square wave, it can be used not only to determine whether the glass substrate has been successfully drilled, but also to further identify the residual glass coverage when the glass substrate has not been successfully drilled, namely, the degree of the via hole can be confirmed by the present invention. In Table 1, 60 Hz and 1500 Hz are mains background values, and after filtering by the present invention, the basic constant frequency will be maintained, and the frequency oscillation of the 500 Hz square wave generated by the present invention will be not affected.

TABLE 1

| Glass Coverage | Frequency | | |
| --- | --- | --- | --- |
| | 500 Hz | 60 Hz | 1500 Hz |
| 100% Glass (Non-through hole) | 0.3330 | 0.1366 | 0.01947 |
| 75% Glass (Partially through hole) | 0.3114 | 0.1365 | 0.01847 |
| 50% Glass (Partially through hole) | 0.3139 | 0.1301 | 0.01756 |
| 40% Glass (Partially through hole) | 0.2937 | 0.1420 | 0.01670 |
| 30% Glass (Partially through hole) | 0.2582 | 0.1399 | 0.01620 |
| 25% Glass (Partially through hole) | 0.2634 | 0.1317 | 0.01504 |
| 20% Glass (Partially through hole) | 0.2357 | 0.1354 | 0.01487 |
| 10% Glass (Partially through hole) | 0.2123 | 0.1332 | 0.01342 |
| 0% Glass (Fully through hole) | 0.1707 | 0.1355 | 0.01040 |

The first signal S1 shown in Table 1 as the 500-Hz square wave is suitable for the glass substrate in this embodiment, but this is not a limitation. In other words, if the medium M is another material substrate, such as the silicon substrate, the first signal S1 can also be the square wave of other frequencies.

<Defect Detection Method>

FIG. 7 shows a flow chart of the non-destructive defect detection method of the present invention. As shown in the figure, the non-destructive defect detection method of the present invention includes the following steps:

Step 700: Generating a first signal by a signal emitting module;

Step 710: the first signal is transmitted and travels through a transmitting electrode, a medium M and a receiving electrode to generate a second signal; wherein the transmitting electrode, the medium and the receiving electrode have an equivalent capacitance including a capacitance of the medium which may be solid or comprising air;

Step 720 (optional): the second signal is processed by a filtering/amplification signal module, such as filtering, amplifying, or modifying the second signal to obtain a detection result.

In summary, the non-destructive defect detection module and method for high-speed circuit glass substrates of the present invention uses the capacitive transmitting electrode 200 to emit the first signal S1. Depending on the different permittivity values of the air and the glass, the different strength of the second signal S2 is received by the capacitive receiving electrode 300. Then, the filtering frequency range is adjusted and the amplification ratio is changed to make the differences in the signals received from the air and the glass apparent, thereby detecting whether the drilling is successful.

Figure 8:
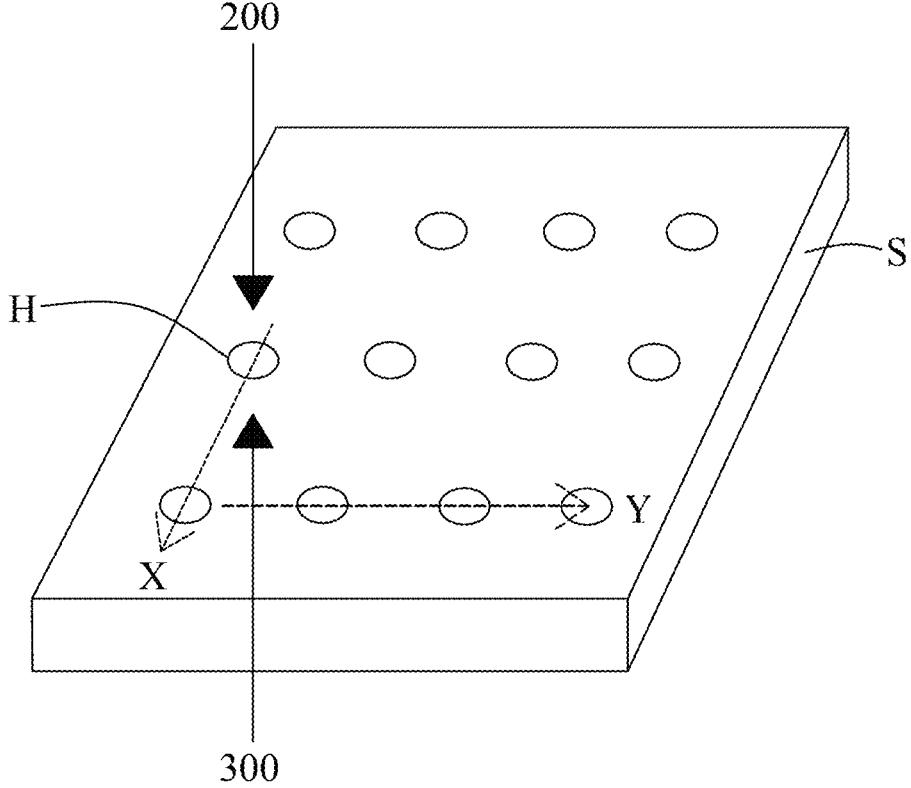
FIG. 8 is a stepwise scan schematic diagram of the defect detection module of the present invention using an X-Y axis platform.

Referring to FIG. 8. The non-destructive defect detection module 100 of the present invention can adjust the detection method according to the size of the carrier area of the medium to be tested. When targeting a larger carrier size, it can be configured as multiple sets of arrayed defect detection modules for detection, or it can be scanned stepwise each via hole H in an X-Y axis platform direction to achieve high-precision detection purposes.

The above specification, examples, and data provide a complete description of the present disclosure and use of exemplary embodiments. Although various embodiments of the present disclosure have been described above with a certain degree of particularity, or with reference to one or more individual embodiments, those with ordinary skill in the art could make numerous alterations or modifications to the disclosed embodiments without departing from the spirit or scope of this disclosure.

What is claimed is:

1. A defect detection module comprising a signal emitting module, a transmitting electrode, a receiving electrode, and a signal processing module; wherein;

the signal emitting module generates a first signal;

the receiving electrode spaced apart from the transmitting electrode;

a substrate comprising glass, silicon, or a combination thereof, the substrate having a through hole, a partially through hole or a non-through hole formed therein;

a medium disposed within the through hole or the non-through hole and between the transmitting electrode and the receiving electrode, the medium including air, the substrate material, or a combination thereof;

wherein the first signal is capacitively coupled from the transmitting electrode, through the medium, to the receiving electrode to generate a second signal; wherein:

the transmitting electrode, the medium and the receiving electrode have an equivalent capacitance; and the signal processing module which processes and optimizes the second signal to obtain a detection result by discriminating a defect within the medium based on differences in dielectric properties of the medium; and the defect is detected without physical contact between the transmitting electrode, the receiving electrode, and the medium.

2. The defect detection module according to claim 1, wherein the signal processing module comprises a high-pass filter through which the second signal passes through the high-pass filter.

3. The defect detection module according to claim 1, wherein the signal emitting module generates the first signal as a square wave signal, and the signal processing module includes a filtering.

4. The defect detection module according to claim 1, wherein a signal processing circuit is used to isolate a capacitive electrodes of the transmitting electrode.

5. The defect detection module according to claim 2, wherein a signal processing circuit is used to isolate a capacitive electrodes of the transmitting electrode.

6. The defect detection module according to claim 1, wherein further comprising a computer operatively coupled to the signal processing module for recognizing, classifying, or summarizing the detection result.

7. The defect detection module according to claim 1, wherein the transmitting electrode and the receiving electrode are capacitive electrodes.

8. The defect detection module according to claim 1, wherein the defect detection module is configured in multiple arrays for detecting the medium; or the defect detection module scans the medium stepwise in an X-Y axis direction.

* * * * *